United States Patent
Sill et al.

(10) Patent No.: US 6,367,413 B1
(45) Date of Patent: Apr. 9, 2002

(54) APPARATUS FOR MONITORING SUBSTRATE BIASING DURING PLASMA PROCESSING OF A SUBSTRATE

(75) Inventors: Edward L. Sill, San Diego, CA (US); William D. Jones, Phoenix; Craig T. Baldwin, Chandler, both of AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/580,824

(22) Filed: May 26, 2000

Related U.S. Application Data

(63) Continuation-in-part of application No. 09/334,046, filed on Jun. 15, 1999.

(51) Int. Cl.[7] .................................................. C23F 1/02
(52) U.S. Cl. ............................. 118/723 E; 118/723 E; 118/728
(58) Field of Search .................. 118/723 E, 723 ER, 118/728, 712, 723 I, 723 IR, 723 MW, 723 ME, 723 MR, 723 MA, 723 AN; 156/345; 315/111.21, 111.31; 361/225, 233, 234, 235

(56) References Cited

U.S. PATENT DOCUMENTS

| | | | |
|---|---|---|---|
| 5,117,121 A | 5/1992 | Watanabe et al. | 307/130 |
| 5,591,269 A | 1/1997 | Arami et al. | 118/723 |
| 5,708,556 A | 1/1998 | van Os et al. | 361/234 |
| 5,716,486 A * | 2/1998 | Selwyn et al. | 156/345 |
| 5,737,175 A | 4/1998 | Grosshart et al. | 361/234 |
| 5,820,723 A | 10/1998 | Benjamin et al. | 156/345 |
| 5,886,866 A | 3/1999 | Hausmann | 361/234 |
| 6,033,482 A * | 3/2000 | Parkhe | 118/728 |
| 6,254,683 B1 * | 7/2001 | Matsuda et al. | 118/500 |

FOREIGN PATENT DOCUMENTS

| | | |
|---|---|---|
| EP | 0 819 780 A2 | 1/1998 |
| EP | 0 819 780 A3 | 5/1998 |

* cited by examiner

*Primary Examiner*—Gregory Mills
*Assistant Examiner*—Luz Alejandro
(74) *Attorney, Agent, or Firm*—Wood, Herron & Evans L.L.P.

(57) ABSTRACT

A processing system for processing a substrate with a plasma comprises a processing chamber configured for containing a plasma and a substrate support. Electrodes are coupled to the substrate support and an RF power source is coupled to each of the electrodes for biasing the electrodes to create a DC bias on a substrate positioned on the supporting surface. A first comparator having first and second inputs is electrically coupled to one of the electrodes with an isolating device being coupled between the first and second inputs to isolate the first input from the bias on the one electrode. The comparator has an output reflective of a voltage difference between the first and second inputs. A second comparator has a first input coupled to the first electrode and a second input coupled to the second electrode, and has an output reflective of a voltage difference between the first and second inputs resulting from the bias difference between the first and second electrodes.

16 Claims, 2 Drawing Sheets

APPARATUS FOR MONITORING SUBSTRATE BIASING DURING PLASMA PROCESSING OF A SUBSTRATE

RELATED INVENTIONS

This invention is a continuation in part of application Ser. No. 09/334,046, entitled Process, Apparatus, and Method for Improved Plasma Processing of a Substrate, filed Jun. 15, 1999, which is incorporated herein in its entirety.

FIELD OF THE INVENTION

This invention relates generally to the processing of a substrate utilizing a plasma in the production of integrated circuits, and specifically relates to the determination of substrate bias parameters in a plasma processing system, such as one utilizing an electrostatic chuck to secure a substrate to a susceptor during processing.

BACKGROUND OF THE INVENTION

Gas plasmas are widely used in a variety of integrated circuit fabrication processes, including plasma etching and plasma deposition applications, such as PECVD. Generally, plasmas are produced within a processing chamber by introducing a low-pressure process gas into the chamber and then directing electrical energy into the chamber for creating an electric field therein. The electric field creates an electron flow within the chamber which ionizes individual gas molecules by transferring kinetic energy to the molecules through individual electron-gas molecule collisions. The electrons are accelerated within the electric field, producing efficient ionization of the gas molecules. The ionized particles of the gas and the free electrons collectively form what is referred to as a gas plasma.

Gas plasmas are useful in a variety of different processes. One commonly used plasma process is a plasma etch process wherein a layer of material is removed or "etched" from a surface of a substrate. In an etch process, the ionized gas particles of the plasma are generally positively charged, and the substrate is negatively biased such that the positively ionized plasma particles are attracted to the substrate surface to bombard the surface and thereby etch the substrate surface. For example, a substrate might be etched to remove an undesirable material layer or coating on the substrate before another layer is deposited. Such a pre-deposition etch process is often referred to as etch cleaning of the substrate.

Other common plasma processes involve deposition, wherein a material layer is deposited upon the substrate. Chemical vapor deposition, or CVD, for example, generally involves the introduction of material gases into a processing chamber wherein the gases chemically interact and form a material layer or coating on the exposed substrate surface. A gas plasma can be utilized to enhance the chemical interaction. Consequently, such a CVD deposition process utilizing a plasma is referred to as plasma-enhanced CVD or PECVD. The plasma is utilized to provide energy to the process and enhance the deposition quality and/or deposition rate. Other plasma deposition processes also exist as are commonly understood by a person of ordinary skill in the art.

During plasma processing of a semiconductor substrate, it is often useful to apply an accelerating voltage to the surface of the substrate. The accelerating voltage or substrate bias is utilized to accelerate ions or other charged particles within the plasma to the substrate surface. In an etch process, the charged plasma particles are attracted to the substrate surface to actually bombard the surface and provide the etch as discussed above. In a deposition process, such as PECVD, the energy provided by such charged particle bombardment may be utilized to further enhance the deposition rate or to enhance the deposition quality, as mentioned above.

Generally, biasing of the substrate in plasma enhanced etch and deposition processes is accomplished by capacitatively coupling an RF field from electrodes in the processing chamber, through the substrate, and to the exposed substrate surface which is to be etched, or which is to receive a deposited material layer. Specifically, the electrodes, which are positioned within a susceptor or substrate support, are biased with an RF power supply to create an RF field. The RF field is then capacitatively coupled through the susceptor and substrate to create a relatively uniform DC bias potential across the exposed substrate surface. The substrate surface DC bias, in turn, affects the plasma, as discussed above, to enhance the etch or deposition process.

Within a plasma processing system, the plasma will usually have particular non-uniformities associated therewith. For example, the plasma density is often greatest in the center of the plasma, due to edge effects proximate the sides of the processing chamber. The non-uniformities in the plasma translate to discrepancies within the etch and deposition processes in which the plasma is utilized. For example, an undesirable variation in etch rate may occur wherein the etch rate proximate the center of the substrate is greater than the etch rate proximate the outer edges of the substrate. Furthermore, within a plasma-enhanced deposition process, the deposition may be affected proximate the center of the substrate differently than at the edge of the substrate thus creating a non-uniform deposition layer and a non-uniform deposition rate radially across the substrate.

Attempts have been made in the art to address such plasma non-uniformities in a plasma processing system. For example, U.S. Patent Application entitled "Improved Apparatus and Method for Plasma Processing of a Substrate Utilizing an Electrostatic Chuck," filed May 4, 2000, discloses a plasma processing system which selectively adjusts the bias on the substrate to offset plasma non-uniformities in the system; that application is incorporated herein by reference in its entirety. While that system improves the overall plasma process, it has been difficult to achieve precise selectivity in varying the substrate bias. Therefore, it is an objective of the present invention to provide more precise adjustments to the substrate bias in a plasma processing system for addressing non-uniformities in the plasma.

In accordance with another aspect of the invention, it is desirable to provide precise bias control even in a system utilizing an electrostatic chuck. Particularly during integrated circuit fabrication, the substrate being processed is supported within the processing chamber by a substrate support or susceptor. Oftentimes, the substrate is physically secured on the susceptor during processing, such as to improve heat transfer between the substrate and susceptor. One way of securing a substrate involves the use of an electrostatic chuck (ESC), which uses an applied DC bias to the substrate to electrostatically attract and secure the substrate to the susceptor. Electrostatic chucks are known in the art with suitable designs being shown in U. S. Patent Application entitled "Improved Apparatus and Method for Plasma Processing of a Substrate Utilizing an Electrostatic Chuck," filed May 4, 2000, noted above, and in U.S. Pat. No. 5,117,121, which is also incorporated herein by reference. Electrostatic chucks will usually use the same electrodes as are used to bias the substrate. This practice has made precise measurement of the substrate surface bias levels even more difficult due to the effect of the electrostatic clamping voltage on such measurement. Therefore, it is a further objective to provide more precise biasing of a substrate to address plasma nonuniformities within a processing system utilizing an electrostatic chuck.

It is still another objective of this invention to address the above-discussed objectives without adversely affecting the desired biasing of the substrate surface which is necessary for plasma processing.

SUMMARY OF THE INVENTION

The processing system, in accordance with the principles of the present invention, provides more precise monitoring of substrate bias within a plasma processing system for improved substrate bias control. Additionally, the inventive system provides such precise bias measurements in combination with a system utilizing an electrostatic chuck. Measurements provided by the system may be used to vary the bias across selected portions of the exposed substrate surface for more uniform plasma processing, or selectively varied plasma processing.

To that end, the processing system comprises a processing chamber for containing a plasma. A substrate support is mounted within the chamber for supporting the substrate proximate the plasma. A plurality of electrodes, such as first and second electrodes, are coupled to the substrate support and are positioned proximate the supporting surface. The electrodes are electrically isolated from one another. An RF power source is coupled to each of the electrodes for biasing the electrodes with RF electrical energy. The biased electrodes are operable in conjunction with the substrate support for creating a DC bias on the exposed surface of the substrate positioned on the supporting surface of the substrate support.

In accordance with one aspect of the present invention, a plurality of comparators are utilized to monitor the bias on the individual electrodes for the purpose of selectively varying the bias. More specifically, the first comparator has first and second inputs which are electrically coupled to one of the electrodes. An isolating device is coupled between the inputs and is operable for isolating the first input from the bias on the monitored electrode which is created by the RF power source. The comparator has an output reflective of a voltage difference between the first and second inputs which results from the electrode bias created by the RF power source. Since the first input is isolated from the electrode bias created by the RF power source, the output of the first comparator is reflective of electrode RF bias.

A second comparator provides an indication of the voltage-bias differential between the first and second electrodes. With the output from the first comparator coupled to the one electrode, and the output of the second comparator coupled between both electrodes, the bias level on each of the individual electrodes may be obtained. Specifically, the second comparator has a first input coupled to the first electrode and a second input coupled to the second electrode. The comparator has output reflective of a voltage difference between the first and second inputs which results from the bias difference between the first and second electrodes. With the signal reflective of the bias on one electrode and a signal reflective of the bias differential between the two electrodes, the relative bias on the other, unmeasured electrode, may be obtained. In that way, the relative bias on the first and second electrodes may be monitored so that the bias may be optimally adjusted.

The monitored outputs of the comparators may be utilized to determine the relative bias on the electrodes so that the bias may be adjusted as desired for the plasma process. To that end, variable capacitors are coupled between the RF power source and the electrodes. The capacitance of the capacitors is selectively varied for varying the bias created on the substrate by at least one of the electrodes relative to the bias created on the substrate by the other of the electrodes. In that way, the effect of the plasma on one portion of the substrate relative to the effect of the plasma on another portion of the substrate may be selectively varied.

In accordance with another aspect of the present invention, at least one of the inputs to the comparators is coupled to the respective electrodes through a voltage dividing circuit. The voltage dividing circuit includes a variable resistor which may be selectively adjusted to vary the voltage level at the comparator input. When the processing system utilizes an electrostatic chuck, a DC power source is coupled to the electrodes in addition to the RF power source. The DC power source provides a voltage differential at the electrodes which is necessary for electrostatically clamping the substrate to a susceptor. The variable resistors may be selectively varied to eliminate the effect of the clamping DC bias on the electrodes at the inputs to the comparators. In that way, the outputs of the comparators are directly related to the differences between the inputs caused by the DC bias on the electrodes created by the RF power source.

In accordance with another aspect of the present invention, another comparator is utilized having first and second inputs coupled to the first and second electrodes, respectively. The output of the comparator is also reflective of the voltage difference between the first and second inputs resulting from the bias difference between the first and second electrodes. However, the output is coupled to an automatic adjustment device, such as a servo motor, which is, in turn, coupled to the variable resistor. The servo motor automatically varies the resistance of the variable resistor in order to adjust one of the inputs and to zero the output from the comparator. The output of the comparator drives the servo and the variable resistor until the output is zero. When this is done with the DC power source on and the RF power source off, the bias measurement is essentially not affected by the DC power source because the inputs to the comparator coupled to both the electrodes are adjusted to generate a zero output. Since the inputs to the comparator providing automatic adjustment of the variable resistor are the same as the inputs to the comparator which measures the different bias between the electrodes, automatically zeroing the output of the one comparator will zero the output of the other comparator as well. A disabling switch is coupled between the output of the respective comparator and the automatic adjustment device. The disabling switch is coupled to the RF power source and is operable for disabling the automatic adjustment device when the RF power is delivered to the electrodes. In that, the output of the comparator coupled to both electrodes will not be further varied to zero its output, and therefore it will measure the voltage differential between its first and second inputs to provide an output signal reflective of the bias differential between the electrodes.

Therefore, the signals are generated at the output of the comparators to be reflective of the individual bias levels of the electrodes which are attributable to the RF power supply. In that way, the variable capacitors may be adjusted to achieve the desired electrode bias between the two electrodes. Accordingly, the biasing of the substrate may be similarly selectively varied to achieve the desired results within the plasma process. While the present invention is described with respect to two electrodes, multiple electrodes may also be utilized and their bias levels measured accordingly, utilizing the present invention.

These features and benefits of the invention, and other features and benefits are set forth in greater detail in the Detailed Description hereinbelow made in reference to the drawing figures.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
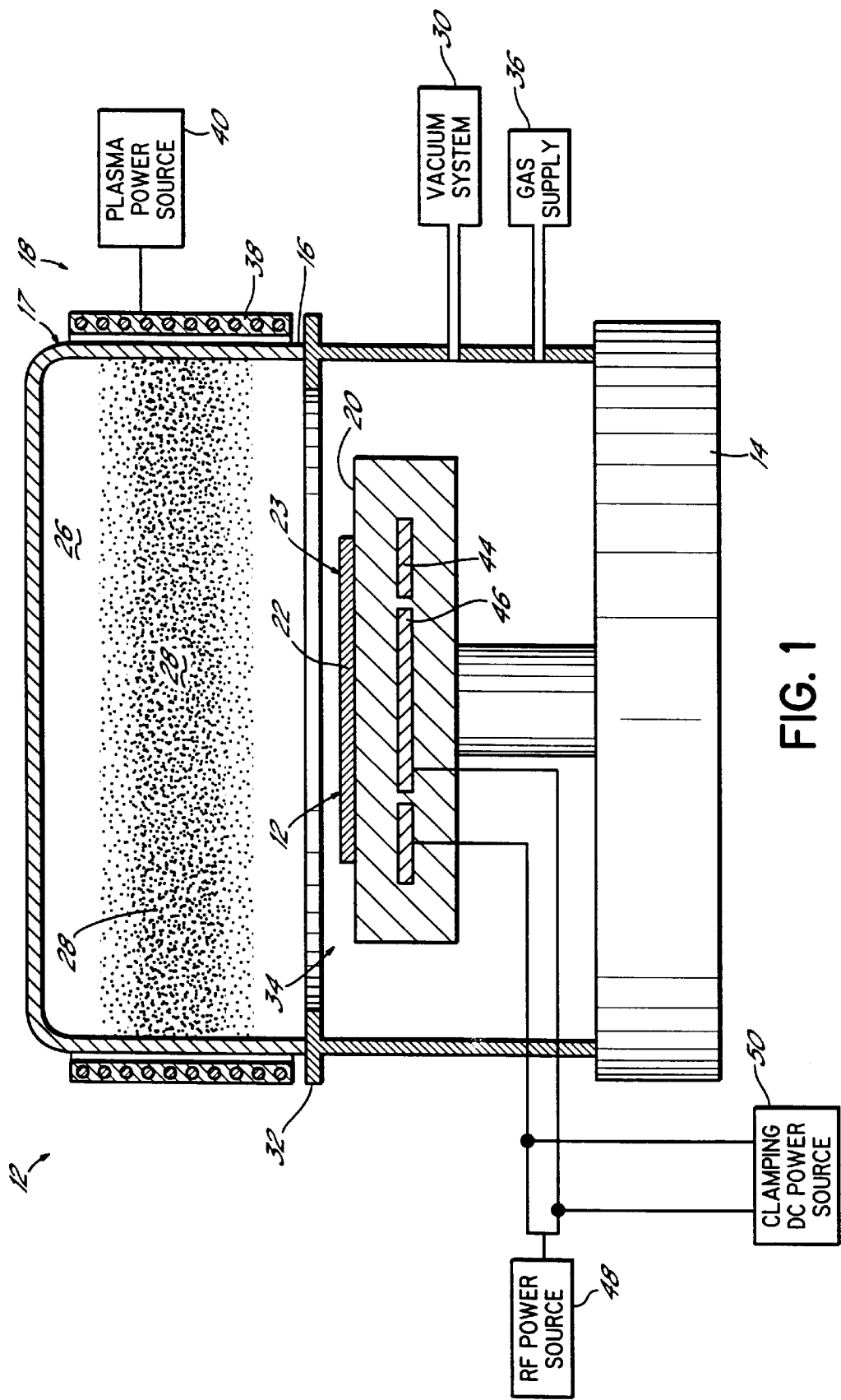
FIG. 1 is a side cross-sectional view of one embodiment of a plasma processing system which might be utilized in accordance with the principles of the present invention.

FIG. 1 illustrates one embodiment of a plasma processing system that may be utilized in accordance with the principles of the present invention. The plasma processing system generally comprises a processing chamber 12, including a base section 14 formed of a suitable metal, such as stainless steel, and a dielectric section 16 formed of a suitable material, such as quartz. A plasma-generating assembly 18 is coupled to the dielectric section 16 of the processing chamber 12. A substrate support assembly or susceptor 20 is positioned within the processing chamber 12 and is configured for supporting a semiconductor wafer or substrate 22 therein for plasma processing. The processing chamber 12, and specifically, the dielectric section 16 defines a process space 26 therein for containing a plasma 28. The substrate 22 is positioned below the process space 26 and plasma 28 in the embodiment of FIG. 1.

In one embodiment of the present invention, the processing system may be a stand-alone plasma processing system which is utilized for an isolated plasma process. In another embodiment, the processing system may be configured to be incorporated into a multi-process system with a plurality of other processing systems and a centrally located substrate transfer module, not shown, which moves substrates between the various systems. Such multi-chamber, multi-process systems are known in the art.

For plasma processing, process space 26 generally must be under a vacuum. Thus the processing chamber 12 is coupled to an appropriate vacuum system 30 including suitable vacuum pumps and valves, as are known in the art, for providing the desired vacuum pressure within process space 26. The processing chamber 12 is appropriately configured with the necessary openings for introducing a vacuum into space 26, as is known in the art.

The plasma-generating assembly 18 is shown in FIG. 1 and is electrically coupled to the dielectric section 16 of processing chamber 12. The plasma-generating assembly 18 inductively couples electrical energy into the dielectric section 16, which is often referred to in the art as a "bell jar" enclosure, and thereby forms a plasma 28 in the process space 26 above substrate support assembly 20 (see FIG. 1). The dielectric section or enclosure 16 is seated on a flange 32 of base 14 which surrounds the open top 34 of base 14. Suitable 0-ring seals and other seals (not shown) are usually positioned between the base 14 and dielectric section 16 for proper vacuum sealing of the various sections of the processing chamber.

For forming a plasma within space 26, a process gas is introduced into the space 26 and electrical energy is electrically coupled into the space to ionize the gas particles to form a plasma. To that end, the processing chamber is coupled to an appropriate process gas supply 36 which introduces a suitable process gas for forming a plasma 28. Any appropriate gas dispersing element (not shown) may be coupled to gas supply 36 for uniformly introducing the process gas, such as Argon, into space 26 for forming a uniform and dense plasma. Gas supply 36 might also contain multiple gases which are mixed together in chamber 12, such as for chemical vapor deposition.

To ignite and sustain a plasma within space 26, the plasma generating assembly includes an inductive element in the form of a helical coil 38 which is wound around dielectric section 16, as illustrated in FIG. 1. The coil 38 is essentially an elongated conductor formed in the shape of a helical coil which is dimensioned to fit around section 16 and up against an outer wall surface 17 of the enclosure. Coil 38 is electrically coupled to a plasma power source 40 which will conventionally include an RF power supply and appropriate RF matching circuitry for efficient coupling of RF power to the coil 38. RF electrical energy from the power source 40 is inductively coupled into the process space 26 by coil 38 to excite the process gas to form plasma 28. Inductively coupled plasmas and the formation of same are known in the art and various different configurations may be utilized for inductively coupling energy into the process space 26. Therefore, FIG. 1 discloses, in a broad conceptual form, only one possible embodiment for inductively coupling a plasma into the processing chamber 12.

Furthermore, it will be readily understood by a person of ordinary skill in the art that a plasma processing system suitable for use in the present invention may take any one of a number of different forms and include differently configured processing chambers. For example, another inductively coupled plasma processing system might utilize a flat coil (as opposed to a helical coil) which is positioned on the top of the processing chamber where energy is coupled through a dielectric window at the top of the chamber. Furthermore, the plasma might be formed capacitatively, rather than inductively. In such a capacitatively coupled system, an electrode element in the process space 26, such as an electrically biased gas-dispersing showerhead (not shown), is utilized in combination with another electrode, such as a biased substrate support assembly 20 and substrate 22. An electric field between the electrodes sustains a plasma proximate the substrate. Accordingly, the present invention may be incorporated with various different plasma processing systems using inductively coupled plasmas or capacitatively coupled plasmas or systems which otherwise form a plasma for processing a semiconductor substrate 22.

In the present invention, multiple electrodes are used to shape a plasma to improve the processing results associated therewith. Referring again to FIG. 1, the embodiment of the invention illustrated therein comprises a plurality of electrodes, including a first electrode 44 coupled to the substrate support 20 and a second electrode 46 also coupled to the substrate support proximate the first electrode 44. The electrodes 44, 46 are shown embedded within the substrate support 20. The second electrode 46 is generally spaced from the first electrode 44 and is electrically isolated therefrom. The present invention anticipates the use of multiple electrodes for creating a DC bias on the substrate surface 23 and selectively varying that DC bias. Therefore, the present invention as disclosed covers systems utilizing at least two electrodes, but possibly a greater number of electrodes, and the claims cover such a multiple electrode processing system. For easier reference herein and in describing the invention, the electrodes illustrated in the drawings are sometimes designated as a first electrode 44 and second electrode 46, although as noted, a third, a fourth, and other electrodes might also be utilized in other embodiments of the invention. Furthermore, the first and second electrodes may be alternatively designated. For example, in the embodiments illustrated in FIGS. 1 and 2, the multiple electrodes include an outer ring electrode 44, which is designated as a first electrode, and an inner disk-shaped electrode 46, which is designated the second electrode. However, such designations may be reversed, such that the electrode 44 is designated the second electrode and the electrode 46 is designated the first electrode.

In accordance with another aspect of the present invention, the DC bias on the electrodes formed by the RF power source 48 is selectively varied between the electrodes. To that end, the bias of one electrode might be selectively varied with respect to a constant bias on the other electrode, or vice versa. Alternatively, the bias of both (or more) electrodes might be selectively varied relative to each other in accordance with the principles of the present invention. Accordingly, the designation of the electrodes as first and second electrodes in the drawings for purposes of illustrating the invention, should not be construed as limiting the invention in any way.

In one embodiment of the invention, the first and second electrodes 44, 46 are embedded within the substrate support or susceptor 20, as shown. The substrate support 20 is preferably formed of a dielectric material, such as aluminum nitride. The electrodes may be of a suitable electrically conductive material such as molybdenum. Suitable electrodes 44, 46 are available as 120 micron thick molybdenum electrodes from N.G.K. of Japan. Other suitable electrode materials may also be utilized in accordance with the principles of the present invention.

Electrodes 44 and 46, as discussed hereinbelow, are electrically coupled to an RF power source which includes an appropriate RF power supply for delivering RF power to the electrodes. In one embodiment of the invention, the electrodes 44, 46 are also utilized to electrostatically clamp substrate 22 to the substrate support 20. To that end, the electrodes 44, 46 are coupled to a clamping DC power source 50 which induces a DC bias on the electrodes to form a suitable electric field, which clamps substrate 22 in accordance with well-known electrostatic clamping principles. The RF power source 48 in combination with the biased electrodes 44, 46 forms an RF-created DC bias on substrate 22 and specifically on an upper surface 23 of the substrate which faces the plasma 28. The bias on substrate surface 23 accelerates ions and other charged particles within the plasma 28 to the surface 23. Such a substrate bias on surface 23 enhances etching in a plasma etch process, or is used to enhance deposition, such as in PECVD. The clamping DC bias formed on a substrate by source 50 is generally confined away from surface 23 and does not significantly affect the RF-created DC substrate bias at surface 23 which interacts with the plasma. While it is known to bias a substrate in such a way for enhancing etching and deposition processes, there has generally been little control over such biasing, and the plasma processes have been left to the vagaries of the plasma 28 formed within the process space 26.

The invention in U.S. patent application Ser. No. 09/565,606, titled "Improved Apparatus and Method for Plasma Processing of a Substrate Utilizing an Electrostatic Chuck," filed on May 04, 2000, and incorporated by reference herein addresses problems in the art by providing selective variation of the RF-created DC bias on the substrate surface through selective biasing of the electrodes 44, 46. The present invention provides a further improvement to such selective biasing by allowing measurement of the particular relative bias created on each of the electrodes so that the bias may be more precisely adjusted for more selective plasma processing.

Figure 2:
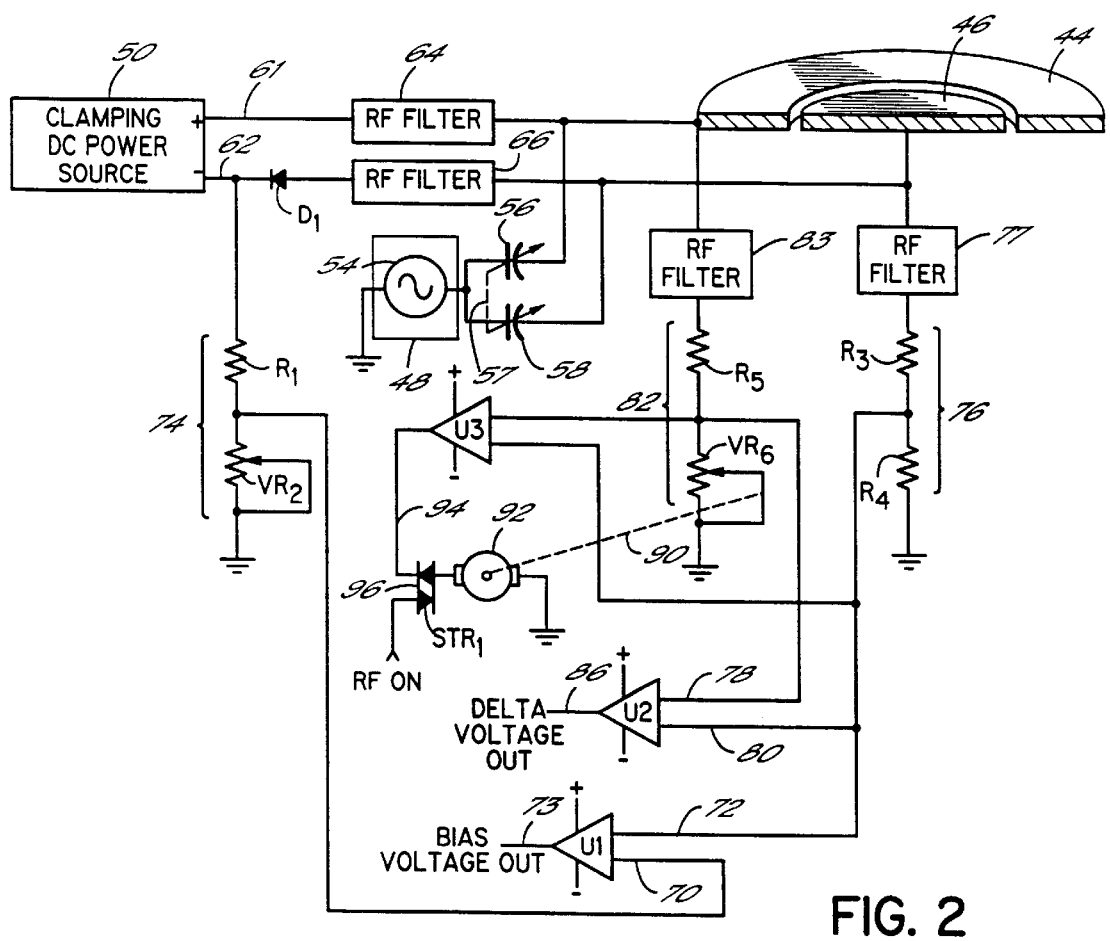
FIG. 2 is a perspective and schematic view of one embodiment of the invention.

Turning now to FIG. 2, one embodiment of the invention is illustrated showing a cut-away perspective view of the first and second electrodes 44,46. The first and second electrodes 44, 46 are coupled to the RF power source 48 which includes an RF power supply 54 capable of producing a suitable RF signal to bias the electrodes. In accordance with one aspect of the present invention, electrically capacitive structures 56, 58 are electrically coupled between the RF power source 48 and the electrodes 44, 46, and one or more of the electrically capacitive structures 56, 58 has a variable or adjustable capacitance for varying the DC bias created on the substrate surface 23 by at least one of the electrodes relative to the DC bias created on the substrate by at least one of the other electrodes. In the embodiment illustrated in FIG. 2, the first electrode 44 is coupled to a first electrically capacitive structure 56 having a variable capacitance. That is, the capacitance of the capacitive structure 56 may be adjusted to be increased or decreased. The second electrode 46 is coupled to the RF power source 48 by a second capacitive structure 58. In the embodiment illustrated in FIG. 2, the second capacitive structure also has variable capacitance. Suitable capacitive structures to be used in the present invention are conventional variable capacitors, such as variable air capacitors or variable vacuum capacitors.

As noted above, with respect to the designation of first and second electrodes, the capacitors 56, 58 are similarly designated for the purpose of illustrating the invention. It is contemplated that more than two electrodes might be utilized and, therefore, more than two capacitors, either all being variable, or a combination of variable and fixed capacitors might be utilized for coupling the various electrodes to the RF power source 48. Accordingly, the indication of capacitors as first and second capacitors herein should not in any way be construed as limiting with respect to the scope of the invention.

In accordance with one aspect of the invention, the variable capacitors 56, 58 are utilized to vary the capacitively-coupled DC bias created on the substrate surface 23 by one of the electrodes relative to the DC bias created on the substrate surface by another of the electrodes. In that way, the effect of the plasma on certain portions of the substrate surface 23 may be selectively varied. Specifically, electrical biasing of each of the electrodes relative to each other may be selectively varied by varying the electrical capacitance of the capacitor coupled between a particular electrode and the RF power source 48. For example, one of the electrodes might be biased with a higher bias voltage than the other electrode, depending upon how the plasma is to be affected. As noted above, plasma in a confined space, such as plasma 28 in the processing chamber 12 will generally experience non-uniformities within the plasma density. Particularly, the density is most often greatest in the center of the chamber 12, and therefore, in the center of the substrate, rather than at the outer edges of the substrate. As a result, variations in etch rate, deposition rate, and other plasma-affected parameters may vary radially across the substrate surface 23. The present invention may be used to address such plasma non-uniformities and to address the radial variability of associated plasma parameters, including etch rates and deposition rates. In one embodiment of the invention, described herein, the electrodes 44, 46 are biased differently relative to each other to address the problem of a greater plasma density in the center of the plasma and substrate surface 23 than at the outer edges of surface 23. As will be readily understood by a person of ordinary skill in the art, various other plasma non-uniformities associated with a particular processing system might also be addressed by the present invention by varying the capacitance of the capacitors and manipulating the RF-created DC bias on one or more of the electrodes and thus on the substrate surface 23.

In FIG. 2, the first capacitor 56 has a variable capacitance which may be increased or decreased as necessary. In order to address a lower plasma density at the outer edges of a substrate, the first electrode 44 should be biased with a higher bias level so that a greater number of plasma particles are attracted to the outer annular or peripheral edge of the substrate surface 23. Decreasing the capacitance of capacitor 56 will increase the bias level on electrode 44. For example, if both of the electrodes 44, 46 are biased similarly by the RF power source 48, with a power level in the range of 300–400 Watts, both of the electrodes might experience a bias level of approximately –100 Volts DC with reference to ground potential. As such, the electrodes would impose a generally uniform DC bias across surface 23 of the substrate 22 in the range of approximately –100 Volts DC. The uniform DC bias across the substrate surface 23 is then subject to the non-uniformities in the plasma 28. The amount of power delivered to the various electrodes 44, 46 will depend upon the capacitance properties of the respective capacitors 56, 58 coupled between those electrodes and the RF power source 48. In one aspect of the present invention, by decreasing the capacitance of variable capacitor 56, more power is delivered to the first or outer electrode 44, and thus the electrode 44 will maintain a higher DC bias level at an outer or annular portion of the substrate surface 23. Of course, by increasing the capacitance of the variable capacitor 56, an opposite result occurs wherein more power is delivered to the second or center electrode 46 relative to the first electrode 44. The electrode 46 is then maintained at a relatively higher bias than electrode 44, thus maintaining a center portion of the substrate surface 23 at a higher bias level than the outer annular portion of surface 23. Maintaining a higher bias level at the outer, annular portion of the substrate surface 23 is desirable for addressing the reduced plasma density normally occurring at the outer edges of the plasma 28 to achieve a uniform etch or deposition rate radially across the substrate surface 23.

To obtain a somewhat similar effect and to increase the bias level on the outer electrode 44 relative to center electrode 46, the second capacitor 58 might be varied as well. In that way, increasing the capacitance of the second capacitor 58 will decrease the amount of power delivered to the electrode 46 and thus decrease the bias level of electrode 46. This effectively increases the bias level proximate the outer, annular portion of substrate surface 23 relative to the bias level at the inner, or center, portion of substrate surface 23. Still further, both electrodes, 56 and 58 might be varied, wherein each of the capacitors 56, 58 are adjusted to increase or decrease their capacitance relative to each other to achieve the desired relative bias level adjustments on the electrodes 44, 46 and across surface 23. For example, raising the relative bias level on the outer or first electrode 44 with respect to electrode 46 may involve decreasing the capacitance of capacitor 56, increasing the capacitance of capacitor 58, or both conditions simultaneously. Referring to FIG. 2, the capacitors 56, 58 might be physically connected together by a linkage 57 for synchronized variation of their capacitances.

The present invention as described hereinabove with respect to FIG. 2 may be utilized in the plasma processing chamber with or without a substrate support which includes an electrostatic chuck. FIG. 2 illustrates components which might be utilized to impose an electrostatic chuck feature on the substrate support utilizing the first and second electrodes 44, 46. Specifically, the clamping DC power source 50 is coupled to the electrodes 44, 46 to provide a DC potential difference between the electrodes and thus electrostatically clamp the substrate to the support 20 in accordance with well-known electrostatic clamping principles. The clamping DC power source would generally include a clamping DC power supply with a positive terminal 61 and a negative terminal 62 coupled to the electrodes. In the embodiment illustrated in FIG. 2, the positive terminal 61 is coupled to the outer or first electrode 44 and the negative terminal 62 is coupled to the inner or second electrode 46. However, the DC clamping bias voltage might be reversed with respect to the electrodes, and the electrostatic chuck would work equally well. When the present invention is utilized with an electrostatic chuck, RF filters 64, 66 are utilized to protect the clamping DC power source 50 from damage by the RF signal from power supply 54. The capacitors 56, 58 illustrated in the embodiment of FIG. 2 are both variable, and therefore, the capacitance of each may be varied for varying the RF-formed DC bias created on the substrate by one of the electrodes relative to the DC bias created on the substrate by the other electrode, as discussed above. When an electrostatic clamping feature is also incorporated with the invention, the capacitors 56, 58 further provide isolation to the RF power supply 54 from the DC signal of power source 50.

As disclosed above, it may be desirable to vary the capacitances of the capacitors 56, 58 simultaneously and in synchronization. To that end, the capacitors could be configured to being adjusted in a synchronized fashion by being coupled together, such as by linkage 57. For example, it may be desirable to maintain a somewhat constant power load on the RF power supply 54 during processing. Accordingly, the variable capacitors 56, 58 are physically coupled or ganged together such that their capacitance values may be adjusted simultaneously in a synchronized fashion to provide a somewhat constant power load. Specifically, the ganged capacitors might be adjusted such that the capacitance of the first capacitor 56 is decreased while the capacitance of a second capacitor 58 is increased a similar amount to thereby provide a greater bias level on the first or outer electrode 44 relative to the second or inner electrode 46. The capacitors 56, 58 are electrically coupled to power supply 54 in a parallel orientation, and thus their capacitances are added mathematically in series to present an overall capacitive load to the power supply. Therefore, the overall power load presented to power supply 54 by the capacitors will be the cumulative of the sum of the capacitances of capacitors 56, 58. Thus, if one capacitor is increased, the other might be decreased by the same amount to maintain a constant load. As such, by ganging the adjustment mechanisms together for the variable capacitors 56, 58, the relative differential DC bias between the electrodes 44, 46 might be varied and adjusted as discussed above while maintaining a relatively constant power load on the RF power supply.

Turning again to FIG. 2, one embodiment of the present invention is described in further detail. The present invention provides a system and methodology for measuring the DC bias which is capacitively created on each electrode by the RF power source 48. To that end, the present invention provides a system for monitoring the DC bias created on at least one of the electrodes by the RF power supply 54 and the DC bias differential measured between two electrodes. Utilizing the bias from one electrode and a differential bias measurement between two electrodes, a bias measurement from the other, unmeasured electrode, might be determined. The present invention allows for precise measurement of the bias on each electrode to thereby allow for precise, selective adjustments to the variable capacitors 56 and 58 to achieve a desired DC bias at the substrate surface 23. The embodiment illustrated in FIG. 2 utilizes an electrostatic clamp, and therefore, the electrodes are biased with RF from RF source 48 and a DC signal from DC power source 50.

More specifically, a first comparator U1 has a first input 70 and a second input 72. The first comparator U1 has an output 73, designated as Bias Voltage Output in FIG. 2. The first and second inputs 70, 72 of the comparator U1 are electrically coupled to one of the electrodes, such as electrode 46. Terminal 62 of the clamping DC power source 50 is coupled to electrode 46, and each of the comparator inputs 70, 72 are electrically coupled between electrode 46 and the power source 50. A voltage dividing circuit 74 is electrically coupled between power source 50 and the input 70 to provide an input signal to components U1. The voltage dividing circuit includes a resistor R1 and a variable resistor VR2. Input 70 is connected between the resistors R1 and VR2 of the voltage dividing circuit 74. RF filter 66 isolates the input 70 from the RF signal of RF power supply 54.

Input 72 is coupled to the electrode 46 and power source 50 through a voltage dividing circuit 76. The voltage dividing circuit 76 includes resistors R3 and R4. Input 72 is connected between resistors R3 and R4. An RF filter 77 isolates input 72 from the RF signal of power supply 54. Comparator U1 may be configured utilizing a differential op amp to provide a differential signal at output 73 based upon the differences in the voltage levels between inputs 70 and 72.

An isolating device, such as a diode D1, is electrically coupled between the first input 70 and second input 72. Specifically, D1 is coupled to the negative terminal 62 of power source 50 in the orientation shown in FIG. 2. The isolating device D1 is utilized to provide differential voltage signals at the inputs 70, 72 in accordance with the principles of the present invention. Specifically, to measure the bias voltage on electrode 46 from the RF power source 48, the power source 48 is turned off and the resistance of VR2 is varied with DC power source 50 on, such that the input voltage on both of the inputs 70 and 72 are equal. The input voltage on input 72 is fixed, due to the fixed values of resistors R3 and R4 and the voltage dividing circuit 76. Therefore, VR2 is adjusted so that input 70 equals input 72 to yield essentially no output voltage on output 73 of comparator U1. Comparator U1 will provide essentially a zero or very small output voltage when inputs 70 and 72 are equal. Once VR2 has been adjusted to zero the output of comparator U1, the RF power source 48 is turned on so that the electrode 46 builds up an RF-created DC bias. The blocking diode D1 prevents the DC bias created on electrode 46 from creating a current in the voltage dividing circuit 74. However, the RF DC bias on electrode 46 will cause current in the voltage dividing circuit 76 and therefore a voltage drop across resistor R4. In that way, the input 70 is not significantly affected by the RF power source 48 and input 72 will differ from input 70. As noted above, the effect of the clamping DC power source 50 is negated by variation of the resistance of VR2 to zero the output 73 of comparator U1. As such, the voltage difference between the inputs 70, 72 and the resulting output voltage 73 will generally be solely the result of the RF-created DC bias from power source 48. Therefore, the output 73 of comparator U1 will be proportional to the DC bias voltage on the electrode 46 created by source 48. The isolating device, or blocking diode D1, is operable for isolating the first input 70 from the bias on the electrode 46 created by the RF power source. It is noted that a similar measurement might be made on electrode 44 rather than electrode 46.

A second comparator U2 is utilized to determine the bias difference between the first and second electrodes 44, 46 attributable to the RF power source. To that end, the second comparator U2 has an input 78 electrically coupled to electrode 44 and an input 80 electrically coupled to electrode 46. Referring to FIG. 2, the second input 80 is coupled to electrode 46 through the voltage dividing circuit 76 and RF filter 77, similar to input 72. The input 78 is coupled to electrode 46 through a voltage dividing circuit 82 including resistor R5 and variable resistor VR6. An RF filter 83 isolates input 78 from the RF signal of power source 48. The effect of the clamping DC voltage from power source 50 is also effectively eliminated from inputs 78, 80 of comparator U2 by adjusting the voltage of voltage dividing circuit 82 to create essentially a zero output signal from the output 86 of comparator U2. Resistor VR6 is varied to vary the signal level from voltage divider 82. Output 86 is designated in FIG. 2 as Delta Voltage Out because it is reflective of the bias difference between the electrodes 44, 46. By adjusting VR6 with power source to on, the output 86 is essentially zeroed. The RF power source 48 is then turned on, creating a DC bias on both electrodes 44 and 46. The RF-created DC bias, in turn, creates a current flow through the voltage dividing circuits 76 and 82, resulting in voltage drops across resistors R4 and VR6. The voltage differential between inputs 78 and 80 is reflected at output 86 and is indicative of the different bias levels at the electrodes. Since the circuit had been previously adjusted to remove the effect of the DC clamping voltage from power source 50, the output of comparator U2 is proportional to the DC voltage difference between the inner and outer electrodes 44, 46.

Knowing the relative DC bias of one electrode, such as electrode 46, and the differential bias between the electrodes 44 and 46, the relative bias level on the individual, unmeasured electrode 44 can be determined mathematically. Of course the bias level on electrode 44 might have been measured whereas the bias level on electrode 46 might be determined mathematically in an alternative embodiment of the invention. The representative output voltage signals from 73 and 86 of the comparators are utilized to provide empirical data for varying capacitors 56 and 58 to achieve a desired and precise relative bias of the electrodes 44 and 46 and relative bias of the substrate surface 23. For example, it may be desirable to bias one electrode at a level twice as high as the other electrode. The output signals 73, 86 will reflect the relative bias voltage levels on the electrodes 44 and 46. Using the data from the outputs, the variable capacitance of the capacitors 56 and 58 might be empirically adjusted to achieve specific bias level differentials between the electrodes 44, 46 or to provide uniform bias levels at the electrodes and ultimately at the substrate surfaces.

Alternatively, the present invention might be utilized to ensure that the clamping voltages are balanced. To that end, through selection of the resistant values utilized in the voltage dividing circuits 76 and 82, the delta voltage attributable to the clamping DC power source 50 might be determined and the signal from the power source 50 might be adjusted to achieve balanced or equal clamping voltages on the electrodes 44 and 46.

In accordance with another aspect of the present invention, another comparator U3 may be configured similarly to comparator U2 for measuring the differential voltage between electrodes 44 and 46 so that the output of comparator U2 may be automatically zeroed. The output of comparator U3 is coupled to an automatic adjustment device which, in turn, is coupled to variable resistor VR6. The automatic adjustment device automatically varies the resistance of the variable resistor VR6, as indicated by dashed line 90. Accordingly, the automatic adjustment device 92 may be appropriately mechanically or electrically coupled to the resistor VR6 for such operation. One suitable automatic adjustment device 92 is a servo motor which may be used to vary the resistance of VR6. To that end, the output 94 of comparator U3 is coupled to the servo motor 92 to drive the servo motor to automatically zero out the voltage of output 94 from comparator U3. In that way, the output 86 of comparator U2 is also automatically driven to zero since the comparators U2 and U3 are essentially coupled in parallel to the electrodes 44 and 46. For taking a measurement of the delta voltage between the electrodes 44 and 46, a disabling switch, such as STR1 is coupled between the output 94 of comparator U3 and the servo motor 92. The STR1 is also operatively coupled to the RF power source through line 96 such that when the RF power source is on, and RF power is delivered to the electrodes 44 and 46, STR1 is open and the servo motor is disabled from further adjusting the resistance VR6. As such, the effect of the DC clamping voltage on the comparators U2 and U3 is zeroed by the servo motor 92. When the RF power supply 54 is turned on, the servo motor 92 is disabled and the comparators U2 and U3 will measure the bias differential created between the electrodes 44 and 46 by the RF power supply 54 and the resulting RF-created DC bias.

As noted above, the outputs of the comparators U1, U2, and U3 provide empirical data for adjusting the variable capacitors 56 and 58 to achieve the desired relative DC bias voltage levels on the electrodes 44 and 46. The differential voltage signals at the outputs 73, 86, and 94 might be utilized directly to determine how the capacitors 56, 58 are to be adjusted. Alternatively, a table or chart might be created from the various output voltages for yielding the various capacitance levels necessary to achieve a desired DC bias level on the electrodes 44 and 46, and ultimately on the substrate surface 23.

The present invention is not restricted to use with electrodes having the specific concentric embodiment illustrated in FIGS. 1 and 2, but rather may be used to vary the bias voltage between numerous electrodes for various geometric configurations. For example, an electrode configuration, often referred to as a double-D configuration, which utilizes two electrodes having a gap therebetween may be used with the invention. Such a configuration is often utilized with an electrostatic clamp and thus may also be suitable for use with the present invention to vary the bias level proximate one side of the substrate relative to the other side of the substrate, such as to address plasma non-uniformities on one side of a process chamber versus the other side of the chamber. It will be readily understood by a person of ordinary skill in the art that other electrode configurations would also be suitable for use with the present invention. Furthermore, more than two electrodes may also be utilized for further tailoring the bias on the substrate to address non-uniformities in the plasma processing system. For example, three or four concentric electrodes might be utilized, similar to the arrangement in FIGS. 1–2, to further tailor the effect on the plasma. The various voltage levels of the electrodes would then be measured in accordance with the principles of the invention described herein.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate with a plasma comprising:

a processing chamber configured for containing the plasma;

a substrate support within the chamber having a supporting surface for supporting the substrate proximate the plasma;

at least first and second electrodes coupled to the substrate support, the electrodes each being positioned proximate the supporting surface and being electrically isolated from one another;

an RF power source coupled to each of the electrodes for biasing the electrodes, the biased electrodes developing a DC bias thereon and operable for creating a DC bias on the substrate positioned on the supporting surface;

a first comparator having first and second inputs electrically coupled to one of the electrodes to measure the DC bias of the electrode, an isolating device being coupled between the first input and the second input and operable for isolating the first input from the DC bias on the one electrode created by the RF power source, the comparator having an output reflective of a voltage difference between the first and second inputs resulting from the electrode DC bias created by the RF power source;

a second comparator having a first input coupled to the first electrode and a second input coupled to the second electrode, the comparator having an output reflective of a voltage difference between the first and second inputs of the second comparator resulting from the DC bias difference between the first and second electrodes;

wherein the relative RF-created DC bias levels on the first and second electrodes may be monitored so that the DC bias levels may be optimally adjusted.

2. The processing system of claim 1 further comprising a first capacitor electrically coupled between the RF power source and at least one of the electrodes;

the first capacitor having a variable capacitance for varying the DC bias created on the substrate by the at least one electrode relative to the DC bias created on the substrate by at least one of the other electrodes of the electrodes, the varied DC bias thereby varying the effect of a plasma on one portion of the substrate relative to the effect of the plasma on another portion of the substrate.

3. The processing system of claim 2 further comprising a second capacitor coupled to another of said electrodes such that the DC bias created by the electrodes may be varied relative to each other.

4. The processing system of claim 1 wherein the substrate support is formed of a dielectric material and the electrodes are embedded in the dielectric material.

5. The processing system of claim 1 further comprising a DC power source coupled to the electrodes, the DC power source operable for creating a DC potential difference between the two electrodes for electrostatically clamping a substrate to the supporting surface of the substrate support.

6. The processing system of claim 1 wherein at least one of the inputs of the first comparator is coupled to the electrode through a voltage dividing circuit, the voltage dividing circuit having a variable resistor which may be adjusted to vary a voltage level at the comparator input.

7. The processing system of claim 1 wherein at least one of the inputs of the second comparator is coupled to a respective electrode through a voltage dividing circuit, the voltage dividing circuit having a variable resistor which may be adjusted to vary a voltage level at the comparator input.

8. The processing system of claim 7 further comprising an automatic adjustment device coupled to the variable resistor for automatically varying the resistance of the variable resistor, the automatic adjustment device being coupled to the output of the second comparator such that the resistance is varied based upon said output of the second comparator.

9. The processing system of claim 8 further comprising a disabling switch operably coupled to the RF power source and the automatic adjustment device, the disabling switch operable for disabling the automatic adjustment device when RF power is delivered to the electrodes by the RF power source.

10. The processing system of claim 7 further comprising a third comparator having a first input coupled to the first electrode and a second input coupled to the second electrode, the third comparator having an output reflective of a voltage difference between the first and second inputs of the third comparator resulting from the bias difference between the first and second electrodes.

11. The processing system of claim 1 wherein said isolating device is a diode.

12. A processing system for processing a substrate with a plasma comprising:

a processing chamber configured for containing the plasma;

a substrate support within the chamber having a supporting surface for supporting the substrate proximate the plasma;

first and second electrodes coupled to the substrate support, the electrodes each being positioned proximate the supporting surface and being electrically isolated from one another;

a DC power source coupled to the electrodes, the DC power source operable for creating a DC potential difference between the two electrodes for electrostatically clamping the substrate to the supporting surface of the substrate support;

an RF power source coupled to each of the electrodes simultaneously with the DC power source for biasing the electrodes, the RF biased electrodes developing a DC bias thereon and operable for creating a DC bias on the substrate positioned on the supporting surface;

a first comparator having first and second inputs each electrically coupled to one of the electrodes to measure the DC bias of the electrode, an isolating device being coupled between the first input and the second input and operable for isolating the first input from the DC bias on the one electrode created by the RF power source, the comparator having an output reflective of a voltage difference between the first and second inputs resulting from the electrode DC bias created by the RF power source;

at least one of the first comparator inputs being coupled to one of the electrodes through a voltage dividing circuit including a variable resistor which may be adjusted to vary a voltage level at the comparator input;

a second comparator having a first input coupled to the first electrode and a second input coupled to the second electrode, the second comparator having an output reflective of a voltage difference between the first and second inputs of the second comparator resulting from the bias difference between the first and second electrodes;

at least one of the second comparator inputs being coupled to one of the electrodes through a voltage dividing circuit including a variable resistor which may be adjusted to vary a voltage level at the comparator input;

wherein the relative RF-created DC bias levels on the first and second electrodes may be monitored so that the DC bias levels may be optimally adjusted.

13. The processing system of claim 12 further comprising an automatic adjustment device coupled to the variable resistor which is coupled to the second comparator for automatically varying the resistance of the variable resistor, the automatic adjustment device being coupled to the output of the second comparator such that the resistance is varied based upon said output.

14. The processing system of claim 13 further comprising a disabling switch operably coupled to the RF power source and the automatic adjustment device, the disabling switch operable for disabling the automatic adjustment device when RF power is delivered to the electrodes by the RF power source.

15. The processing system of claim 12 further comprising a third comparator having a first input coupled to the first electrode and a second input coupled to the second electrode, the third comparator having an output reflective of a voltage difference between the first and second inputs of the third comparator resulting from the bias difference between the first and second electrodes.

16. The processing system of claim 12 wherein said isolating device is a diode.

* * * * *